United States Patent [19]

Case et al.

[11] Patent Number: 4,899,255

[45] Date of Patent: Feb. 6, 1990

[54] HEAT SINK CLIP AND ASSEMBLY AND METHOD OF MANUFACTURE

[75] Inventors: Maxwell H. Case; Lawrence M. Hartzell, both of New Braunfels, Tex.; David W. Currier, Algonquin, Ill.

[73] Assignee: Motorola Inc., Schaumburg, Ill.

[21] Appl. No.: 223,507

[22] Filed: Jul. 25, 1988

[51] Int. Cl.⁴ .................................. H01L 23/36
[52] U.S. Cl. .................................. 361/386; 361/388
[58] Field of Search ............... 361/386, 388, 389, 381; 357/81; 29/825, 839, 832

[56] References Cited

U.S. PATENT DOCUMENTS

| | | | |
|---|---|---|---|
| 2,541,828 | 2/1951 | Peck | 248/361 |
| 2,808,576 | 10/1957 | Brown | 339/112 |
| 2,888,228 | 5/1959 | Jarvis | 248/316 |
| 3,208,511 | 9/1965 | McAdam | 165/80 |
| 3,519,889 | 7/1970 | Monaco | 317/100 |
| 3,572,428 | 3/1971 | Monaco | 165/80 |
| 4,008,487 | 2/1977 | Vogt | 357/81 |
| 4,203,488 | 5/1980 | Johnson et al. | 165/80 B |
| 4,215,361 | 7/1980 | McCarthy | 357/81 |
| 4,563,725 | 1/1986 | Kirby | 361/388 |
| 4,648,008 | 3/1987 | Neyroud et al. | 361/388 |

Primary Examiner—Roy N. Envall, Jr.
Attorney, Agent, or Firm—Phillip H. Melamed

[57] ABSTRACT

A through slot is provided in the central apex portion of a U-shaped heat sink clip and results in an advantageous assembly and method of manufacture. A heat sink and power transistor are clamped together by arm portions of the clip. The slot is used either to permit the passage of an insertion tool for holding the clip open during attachment of the clip to the heat sink and power transistor device or to permit passage of external leads of the power transistor. In either case, the resultant heat sink assembly does not require opening of the clip by providing access to ends or outer projections of the clip arm portions by mounting tools or by providing additional exterior clip projections. Thus a much more compact and readily manufacturable heat sink assembly is provided.

30 Claims, 3 Drawing Sheets

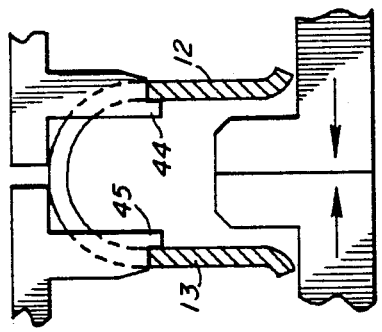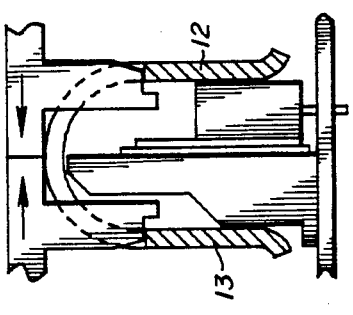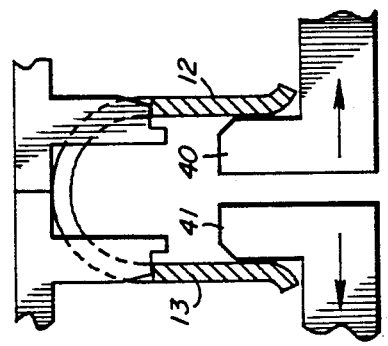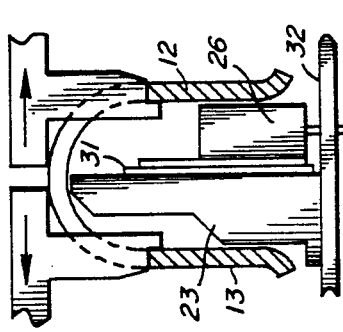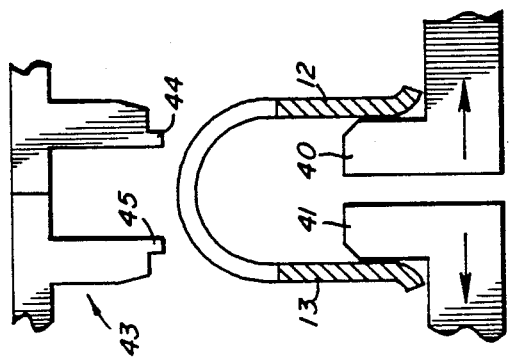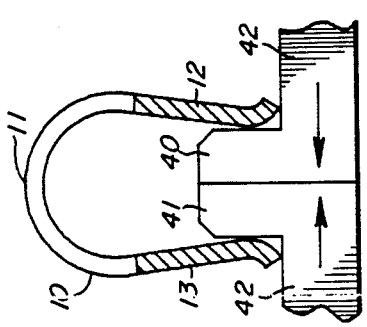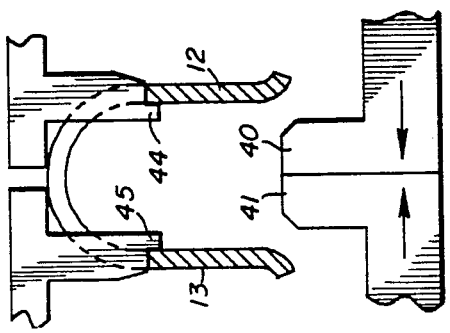

HEAT SINK CLIP AND ASSEMBLY AND METHOD OF MANUFACTURE

BACKGROUND OF THE INVENTION

The present invention is generally related to the field of heat sink clips and to their use in providing heat sink assemblies.

In prior heat sink assemblies, spring clips have been used to provide a clamping force to bias a surface of a power dissipation device, such as a semiconductor, against a heat sink surface. U.S. Pat. Nos. 3,519,889 and 3,572,428 illustrate prior heat sink clips which accomplish this general function. In addition, U or C shaped clips made of resilient spring material have been used to provide heat sink assemblies in which the arms of the clip essentially form a sandwich structure with the heat sink and power dissipation device being clamped therebetween. The use of such U or C shaped clips typically requires a minimum of additional mounting hardware and/or assembly labor as opposed to the use of mounting screws to attach heat dissipation plates of the power dissipation device to the heat sink.

In prior assemblies which utilize the spring action of U or C shaped clips to provide a heat sink assembly, typically the clip is opened by force applied to the ends or exterior projections of the clip arms, and then the clip is inserted over the power dissipation device and heat sink. In one prior assembly, a clip having one exterior projection is positioned such that a heat sink is between its arms. Then force is applied to the exterior projection to force the clip further open to permit insertion of a power transistor between the heat sink and the clip arm having the exterior projection. Then the applied force is released. In situations where there is insufficient room to grip the clip via a force provided exterior to the clip arms, the clip may still be used in a forced assembly type structure in which the clip is forceably slid over the combination of the heat sink and power dissipation device. However, such forced assemblies incur a high risk of damage to the power dissipation device. The prior art has not provided a viable alternative to the use of a simplified heat sink clip assembly relying on the compressive action between opposing arms of the clip when the assembly geometry prevents external access to the clip arms so as to open the clip and when providing a forced heat sink clip assembly is not desired.

SUMMARY OF THE INVENTION

An object of the present invention is to provide an improved heat sink clip and heat sink assembly which overcomes the aforementioned deficiencies of prior heat sink clips and assemblies.

An additional object of the present invention is to provide an improved method of manufacture for heat sink assemblies which allows constructing such assemblies without requiring external access to the clip arms while positioning the clip about a heat sink and power dissipation device.

In one embodiment of the present invention an improved heat sink clip for attaching a power dissipation device to a heat sink is provided. This heat sink clip comprises a generally U-shaped clip constructed of resilient spring material and having a central apex portion and at least two arm portions forming arms of the U shape. Each of the arm portions extends away from an associated opposite end of the central apex portion, respectively, and one of the arm portions has a surface for contacting the power dissipation device and biasing it towards the heat sink. The central apex portion has a slot therein extending through the central apex portion. The slot permits passage of either a portion of the power dissipation device to be heat sunk or permits passage of an insertion tool which facilitates attaching the heat sink clip about the power dissipation device and the heat sink.

The improved heat sink clip assembly which results from the use of the present invention comprises: a heat sink having a surface to which a power dissipation device is to be thermally coupled; a power dissipation device to be attached to the heat sink and having a surface intended for heat transfer coupling to the heat sink surface; and a heat sink clip for attaching the power dissipation device to the heat sink by providing a force for biasing the power dissipation device surface toward and in thermal conductive contact with the heat sink surface. The heat sink clip comprises a generally U-shaped clip constructed of resilient spring material and having a central apex portion and at least two arm portions forming arms of the U shape, each of the arm portions extending away from an associated opposite end of the central apex portion, respectively, and forming an open end of the clip between the arm portions. One of the arm portions has a surface thereof coupled to the power dissipation device. This one of the arm portions biases the power dissipation device surface toward the heat sink surface. The clip central apex portion has a slot therein extending through the central apex portion.

In providing the heat sink clip assembly noted above, preferably the following method of manufacturing is utilized. This method comprises the steps of; providing a heat sink having a surface to which a power dissipation device is to be thermally coupled to; providing a power dissipation device to be attached to the heat sink and having a surface intended for heat transfer coupling to the heat sink surface; providing a heat sink clip having a generally U shape and constructed of resilient spring material, the clip having a central apex portion and at least two arm portions forming arms of the U shape, each of the arm portions extending away from an associated opposite end of the central apex portion and forming an open end of the clip between the arm portions, one of the arm portions having a surface thereof to be coupled to the power dissipation device for biasing the power dissipation device surface toward the heat sink surface, the central apex portion having a slot therein extending through the central apex portion; using at least one tool inserted between the arm portions of the clip to provide the arm portions of the clip further apart than normal; providing the combination of the heat sink and power dissipation device between the arm portions of the clip while the arm portions are spaced further apart than normal by the one tool; and removing the one tool and allowing the arm portions to attempt to return to their normal spacing, thus clamping the device and heat sink therebetween.

In implementing the method of the present invention, as stated above, the tool using step can include the step of inserting projections of a tool through the clip slot, these projections contacting the arm portions and providing for spacing them apart at the further than normal spacing. In addition, the method discussed in the previous paragraph can also be implemented by having the tool using the step include the steps of first providing the heat sink clip with its arm portions positioned on opposite sides of the heat sink and then inserting a tool into the open end of the clip between the arm portions to provide a force between the arm portions to spread the arm portions further apart. Then the power dissipation device can be inserted between one of the arm portions of the clip and the heat sink, with preferably electrical leads extending from a body of the power dissipation device and extending through the heat sink clip slot.

The heat sink clip and assembly of the present invention, and the above noted methods of manufacture of a heat sink assembly, provide distinct advantages for the present invention over the prior art. The assembly of the present invention can be readily manufactured by automatic assembly techniques without requiring external gripping or access to the ends of the arm portions of the clip. This results in a much more compact heat sink assembly. In addition, damage to the power dissipation device which may occur in prior forced assemblies is essentially eliminated due to the preopening of the heat sink clip by tooling projections which contact interior surfaces of the clip arm portions prior to assembling the clip about the heat sink and power dissipation device. It should be noted that while the claims of the present invention refer to the clip as being U-shaped, this is also equivalent to reciting the clip as being C-shaped in that both geometries require a central apex portion and extending arm portions.

The above-noted advantages of the present invention, as well as additional advantages and differences from the prior art structure, are explained in more detail in the subsequent more specific description of the present invention.

BRIEF DESCRIPTION OF THE DRAWINGS

For a more complete understanding of the invention, reference should be made to the drawings, in which:

FIGS. 4a-g comprise a series of assembly drawings which illustrate a method usable for the construction of the heat sink assembly shown in FIG. 2;

DESCRIPTION OF THE PREFERRED EMBODIMENTS

Figure 1:
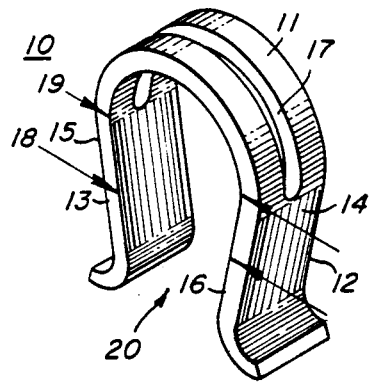
FIG. 1 is a perspective view of a heat sink clip constructed in accordance with the present invention.

Referring now to FIG. 1, a heat sink clip 10 constructed in accordance with the present invention is illustrated. The clip is preferably constructed of resilient spring material such as beryllium copper or spring steel and has a general U shape. The clip has a central apex portion 11 and at least two arm portions 12 and 13 forming arms of the U shape, each of the arm portions extending away from associated opposite ends 14 and 15 of the central apex portion 11, respectively. At least one of the arm portions 12 and 13 having an interior surface 16 for contacting a power dissipation device and biasing it towards a heat sink. The central apex portion 11 has a slot 17 therein extending through the central apex portion and extending at least substantially across the central apex portion in a direction extending between the two arm portions 12 and 13. For the embodiment of clip 10 shown in FIG. 1, the central apex portion 11 is curved in shape between the two arm portions 12 and 13. Portions of each of the two arm portions 12 and 13 at a distance from the central apex portion 11 are nominally spaced apart from each other by a dimension 18 which is less than the spacing 19 between the two arm portions at their juncture to the central apex portion. The clip 10 comprises a unitary metallic member forming the U shape of the clip.

While the clip 10 is recited as having a U shape, this terminology encompasses the clip having a C shape wherein both of these terminologies indicate the same basic configuration. This configuration has a central portion and extending arm portions which form, between the extending arm portions, an open end 20 of the clip 10. A primary feature of the clip 10 is the providing of the slot 17 in the central apex portion 11. This slot, as will be demonstrated subsequently, is used either to permit the passage of an insertion tool or to permit the passage of leads of a power dissipation device. In both instances, an improved heat sink assembly configuration is the result.

Figure 2:
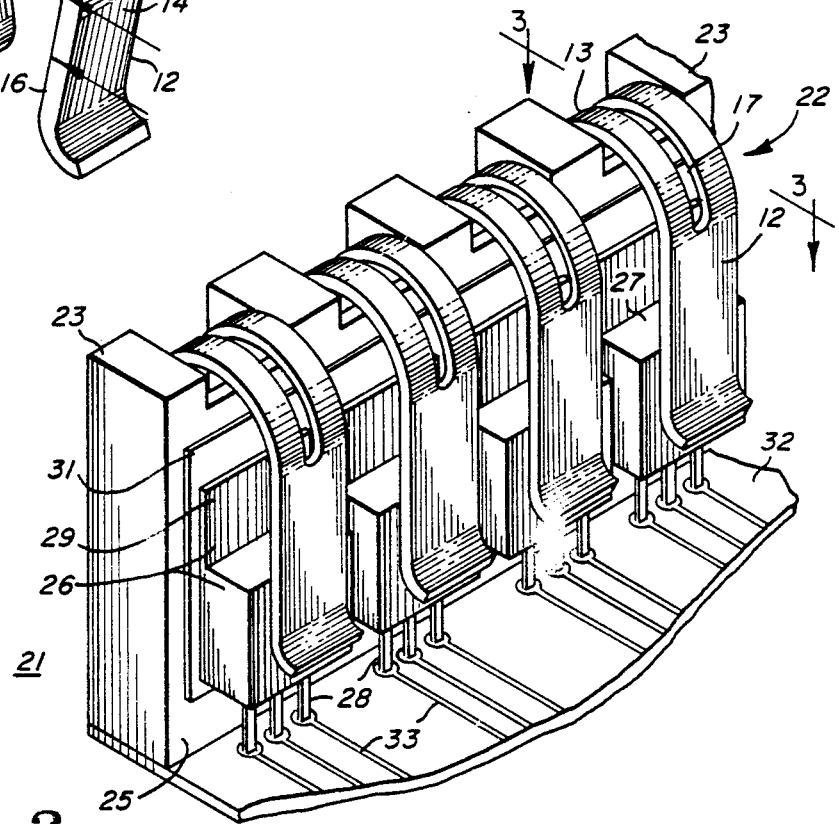
FIG. 2 is a perspective view of a heat sink assembly constructed in accordance with the present invention which utilizes the heat sink clip of FIG. 1.
Figure 3:
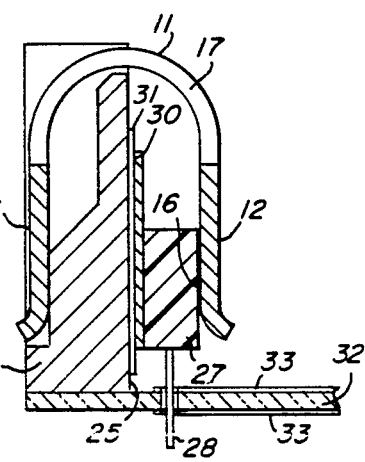
FIG. 3 is a cross sectional view of the heat sink assembly shown in FIG. 2.

Referring to FIG. 2, a perspective view of a heat sink assembly 21 is illustrated which utilizes a plurality of the heat sink clips 10. The heat sink assembly 21 actually comprises a plurality of four individual heat sink subassemblies 22 each of which utilizes one of the heat sink clips 10. FIG. 3 illustrates a cross sectional view one of these heat sink subassemblies 22. Identical reference numerals are used in FIGS. 1, 2 and 3 to identify identical corresponding elements.

Each of the heat sink subassemblies 22 includes part of a heat sink 23, which preferably comprises part of a rectangular protective metallic chassis for an electrical circuit. The heat sink 23 has a surface 25 to which power dissipation devices 26, in each of the subassemblies 22, are to be thermally coupled. The power dissipation devices preferably comprise semiconductor power transistors in conventional TO 220 packages. As is well known, TO 220 packages include a plastic body member 27 having electrical leads which extend away therefrom, and a metallic dissipation plate 29 having a surface 30 intended for heat transfer coupling to a heat sink. In the present case the surface 30 is intended for heat transfer coupling to the heat sink surface 25. As shown in FIGS. 2 and 3, a thin thermally conductive electrical insulation plate 31 is positioned directly between the surfaces 25 and 30.

The heat sink clip 10 essentially attaches the power dissipation device 26 to the heat sink 23 by providing a force for biasing the power dissipation device surface 30 toward and in thermal conductive contact with the heat sink surface 25. More specifically, as is best shown in FIG. 3, the interior surface 16 of the clip arm portion 12 is coupled to the power dissipation device 26 and results in biasing the power dissipation device surface 30 toward the heat sink surface 25. It should be noted that the minimum spacing between the clip arm portions 12 and 13 when the clip is utilized, as in FIGS. 2 and 3 to bias a power dissipation device against a heat sink, is greater than the normal or nominal spacing between these arms. This provides a biasing spring force so as to essentially form a sandwich structure with the heat sink 23 and power dissipation device 26 being clamped between the heat sink clip arm portions 12 and 13.

As shown in FIGS. 2 and 3, the heat sink assembly 21 and heat sink subassemblies 22 include a metallized printed circuit board 32 having conductive paths 33 thereon which are connected to, via preferably solder connections, the power dissipation device electrical leads 28. For the heat sink subassemblies 22 in FIGS. 2 and 3, the electrical leads 28 extend from the device body 27 away from the slot 17. This configuration is somewhat different from the similar heat sink subassembly embodiment shown in FIGS. 5 and 6 in which extending electrical leads of a semiconductor device extend through a slot in a heat sink clip toward a printed circuit board with the semiconductor device positioned on one side of the heat sink clip between arm portions of the clip and the circuit board positioned on an opposite side of the heat sink clip. This alternate assembly configuration will be discussed subsequently in connection with FIGS. 5 and 6.

As noted previously, one advantage of the present invention is that it permits the use of the heat sink clip 10 to thermally join the power dissipation device 26 and heat sink 23 without requiring gripping the heat sink clip 10 at external projections or ends of the arm portions 12 and 13 so as to open the clip for insertion over the device 26 and heat sink 23. This allows the positioning of other electrical components in close proximity to the heat sink clip 10 while minimizing damage to the power dissipation device 26. This damage may occur if the clip 10 is merely slid over the combination of the device 26 and heat sink 23 relying on this sliding force to open the clip 10. Such prior assemblies which rely on the heat sink and power dissipation device to essentially spread apart the arm portions of a U-shaped clip are known and result in assemblies which are complex and difficult to assemble wherein such prior assemblies also run the risk of damaging the power dissipation device.

Referring now to FIGS. 4 a-g, a sequence of assembly drawings is illustrated which demonstrate a preferred method for manufacturing the heat sink subassembly 22 shown in FIG. 3. This method is readily adaptable to conventional automatic component insertion techniques so as to allow the automatic inserting of the heat sink clip 11 about the power dissipation device 26 and heat sink 23 without applying excessive sheer force to the transistor 26 during the insertion process. This preferred heat sink assembly manufacturing process will now be discussed in detail.

Referring to FIG. 4a, a preferred heat sink assembly manufacturing process of the present invention comprises the initial step of inserting two separable projections 40 and 41 of a first tool 42 into the open end 20 of the U-shaped clip 10. Initially the projections 40 and 41 are adjacent to each other as shown in FIG. 4a. Subsequently, as shown in FIG. 4b, the projections 40 and 41 are separated so as to contact and spread the clip arm portions 12 and 13 further apart than normal. As also shown in FIG. 4b, a second, or transfer, tool 43 is positioned about the clip 10, this second tool also having separable projections 44 and 45.

As shown in FIG. 4c, the projections 44 and 45 of the second or transfer tool 43 are inserted through the clip slot 17 while the arm portions 12 and 13 are positioned at the further apart spacing due to the action of the first tool projections 40 and 41. FIG. 4d illustrates that subsequently the first tool projections 40 and 41 are now moved adjacent to each other, and that now the second tool projections 44 and 45 are separated from each other such that these projections now maintain the arm portions 12 and 13 in a further than normal spaced apart position. (Note that the "normal" or "nominal" spacing between the arm portions 12 and 13 is that spacing which occurs when no external forces are applied to the clip 10 and nothing is inserted between the arm portions to prevent these arm portions from approaching each other.)

Referring to FIG. 4e, the next step in the preferred manufacturing process is to remove the first tool projections 40 and 41 from between the arm portions 12 and 13. Subsequently, as illustrated in FIG. 4f, the heat sink clip 10 and second tool projections 44 and 45 are positioned about a subassembly comprising the heat sink 23, the insulation plate 31, the power dissipation device 26 and the printed circuit board 32. Preferably the extending electrical leads 28 of the power dissipation device have already been soldered to the conductive paths 33 on the printed circuit board 32, but this could take place after attaching the clip 10 to the power dissipation device and heat sink. FIG. 4g illustrates the subsequent step of moving the second tool projections 44 and 45 adjacent to each other that such now the spring clip 10 will apply a biasing force biasing the power dissipation device 26 toward and in thermal contact with the heat sink 23. This is due to the arm portions 12 and 13 attempting to return to the normal spacing therebetween. Subsequently, the second tool projections 44 and 45 are removed through the slot 17 and the resultant heat sink subassembly 22 is as shown in FIGS. 2 and 3.

It should be noted that during the preceding description, when tool projections are stated as being adjacent to each other, this does not necessarily mean in direct contact with each other. This terminology merely refers to the fact that they are closer to each other than when the projections are stated as being separated from each other. In addition, while FIGS. 4a-g illustrate a preferred technique of manufacturing a heat sink assembly according to the present invention, obviously other types of manufacturing techniques can be utilized. Some such techniques could involve specially designing the heat sink clip 10 and the second tool projections 44 and 45 such that merely by insertion of these tool projections through the slot 17, the arm portions 12 and 13 would be spaced apart further than normal. Then the clip 10, with the spread apart arm portions 12 and 13, could be subsequently inserted onto the power dissipation device 26 and heat sink 23. The projections 44 and 45 could then be removed through the slot 17. In either situation, the providing of the slot 17 in the heat sink clip has permitted the use of an improved manufacturing method for the construction of heat sink assemblies. In all of the above noted methods, positioning of a preopened heat sink clip about the power dissipation device and heat sink is accomplished without requiring the positioning of tooling mechanisms which contact external projections or ends of the clip arm portions 12 and 13 while inserting the clip about the power dissipation device and heat sink.

Figure 5:
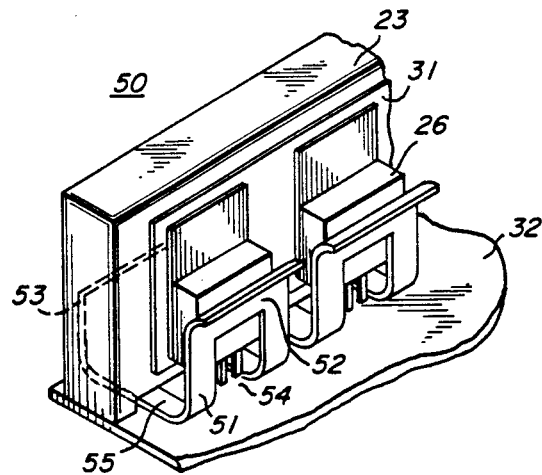
FIG. 5 is a perspective view of another heat sink assembly constructed in accordance with the teaching of the present invention which also uses a heat sink clip.

Referring to FIG. 5, a pair of heat sink subassemblies 50 are shown which are somewhat similar to the heat sink subassemblies 22 shown in FIGS. 2 and 3. Identical reference numerals are utilized for the heat sink subassemblies 50 and 22 to identify substantially identical corresponding components. For the heat sink assembly 50, a heat sink clip 51, corresponding to the heat sink clip 10, is utilized. The clip 51 forms a sandwich structure between its arm portions 52 and 53 and the TO 220 transistor power dissipation device 26, the insulator plate 31 and the heat sink 23. The configuration for the heat sink clip 51 is essentially the same as that of the heat sink clip 10 except that a somewhat wider slot 54 is provided in a central apex portion 55 of the clip rather than the somewhat narrower slot 17 in the clip 10. The reason for the somewhat wider width of the slot 54 is that, as shown in FIG. 5, the extending electrical leads 28 of the power dissipation device 26 now extend from the body 27 through the slot 54 to the printed circuit board 32. The printed circuit board 32 is positioned on one side of the clip 51 with the power dissipation device 26 positioned between the arm portions 52 and 53 and on an opposite side of the clip 51 with respect to positioning of the printed circuit board. Another difference with respect to the heat sink subassembly 50 as compared to the heat sink subassembly 22 is that a portion of the clip central apex portion 55 extends beneath the heat sink 23 and between the printed circuit board 32 and the heat sink 23.

The heat sink subassembly 50, like the heat sink subassembly 23, can be advantageously manufactured without requiring external extending projections on the arm portions 52 and 53 to facilitate opening the heat sink clip for insertion of the heat sink 23 and power dissipation device 26. The manner in which this is accomplished is best understood by reference to FIGS. 6a–c which illustrate a preferred manufacturing process for the heat sink subassembly 50.

Figure 6A:
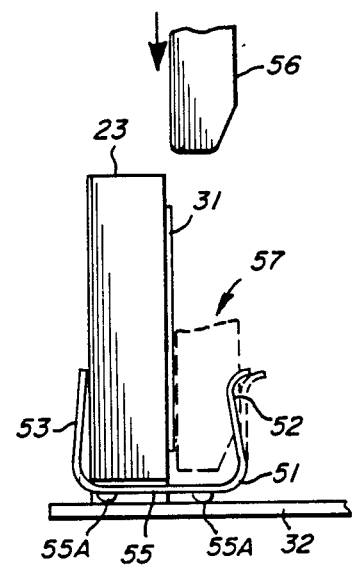
FIGS. 6a-c comprise a series of assembly drawings which illustrate the preferred method for providing the heat sink assembly shown in FIG. 5
Figure 6B:
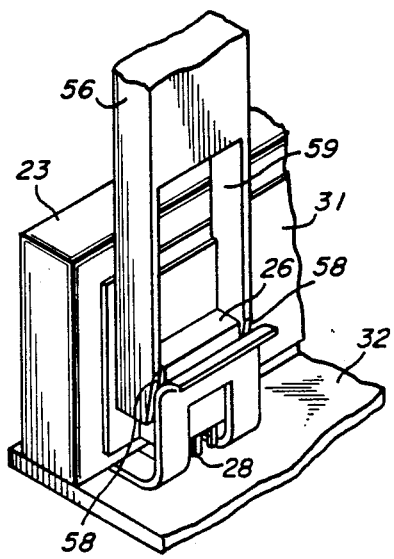
Figure 6C:
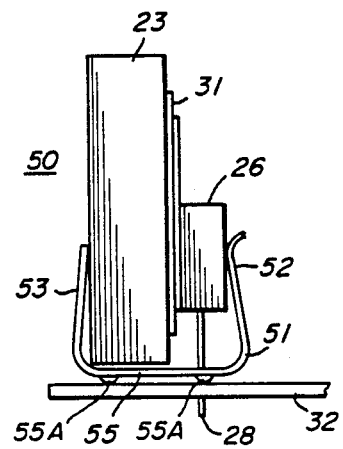

Referring to FIG. 6a, the heat sink subassembly 50 is shown prior to insertion of the power dissipation device 26, comprising a TO 220 transistor. FIG. 6a illustrates that initially a subassembly comprising the heat sink 23 and heat sink clip 51 is provided on the printed circuit board 32 with the central apex portion 55 of the clip positioned between the heat sink and the printed circuit board. FIG. 6a indicates the initial position of an insertion tool 56 above an open end 57 of the clip 51 formed between arm portions 52 and 53 and corresponding to the open end 20 of the clip 10. FIG. 6a indicates in dashed form the position of the insertion tool 56 and heat sink clip arm 52 after subsequent insertion of the tool 56 into open end 57 and between the arm portion 52 and the heat sink 23. This insertion results in increasing the spacing between the arm portions 52 and 53 from a nominal spacing to a further than nominal spacing. This spreading apart of the arm portions 52 and 53 is accomplished by guide runner ramp surfaces 58 of the tool 56. These ramp surfaces 58 are best shown in FIG. 6b which comprises a perspective view of the subassembly 50, as opposed to the planer side view of components shown in FIG. 6a.

After insertion of the tool 56 into the open end 57 of the clip 51, the power dissipation transistor 26 is then inserted, through a channel 59 in the insertion tool 56, such that the electrical leads 28 extending from the body 27 of the transistor pass through the slot 54 and into receiving holes in the printed circuit board 32. This transistor insertion is accomplished without applying any substantial sheer force to the transistor because the heat sink clip 51 has been effectively preopened by the tool 56. Subsequently, the tool 56 is removed resulting in the subassembly 50 shown in perspective in FIG. 5 and shown in planer side view in FIG. 6c. For the resultant subassembly 50, again the heat sink clip provides a bias force to ensure thermal conductivity between the power dissipation device and the heat sink 23. Again, no use of tools which grip external extending projections of the arm portions of the clip is required and a relatively compact heat sink assembly is the result.

Note that preferably dimples 55A are provided on the central apex portion 55 to act as standoffs for the clip, and space most of the clip portion 55 above the top surface of the circuit board 32. This permits minimal interference with the positioning of conductive paths on the circuit board.

It should be noted that in manufacturing either the heat sink subassembly 22 or the heat sink subassembly 50, a tool (40, 43 or 56) is inserted between arm portions of a heat sink clip to provide the arm portions of the clip further apart than normal. For constructing the subassembly 50, as shown in FIG. 6a, the use of a tool includes the steps of first providing the heat sink clip with its arm portions positioned on opposite sides of a heat sink and then inserting a tool into the open end 57 of the clip between the arm portions to provide a force to spread the arm portions further apart. Then, while the arm portions are spread apart by the tool 56, the power dissipation device 26 is inserted between arm portion 52 and the heat sink 23 with the electrical leads 28 of the device 26 positioned to extend through the slot 54 to the metallized printed circuit board 32 which is positioned on one side of the clip 54 while the device body 27 is positioned on an opposite side of the clip. Subsequently, the insertion tool 56 is removed.

In some instances providing the subassembly 22 may be more advantageous than providing the subassembly 50, and for mass production techniques it appears that this is the case if the use of automatic insertion type equipment for the heat sink clip is desired. For manufacturing the subassembly 50, this eliminates the need to position the heat sink clip while it is carried in a preopened position by an insertion tool and this may be advantageous in some manufacturing processes.

While we have shown and described specific embodiments of this invention further modifications and improvements will occur to those skilled in the art. Some of these modifications and improvements have been noted in general in the above discussion of the present invention. All such modifications and improvements which retain the basic underlying principles disclosed and claimed herein are within the scope of this invention.

We claim:

1. A heat sink clip for attaching a power dissipation device to a heat sink, comprising:
   a generally U-shaped clip constructed of resilient spring material and having a central apex portion and at least two arm portions forming arms of said U shape, each of said arm portions extending away from associated opposite ends of said central apex portion, respectively, and forming an open end of said clip between said arm portions;
   one of said arm portions having a surface thereof for contacting said power dissipation device and biasing it toward said heat sink; and
   said central apex portion having a slot therein extending through said central apex portion, whereby said slot permits passage of either a portion of said power dissipation device to be heat sunk or permits passage of an insertion tool which facilitates attaching said heat sink clip about said power dissipation device and said heat sink.

2. A heat sink clip according to claim 1 where said slot extends at least substantially across said central apex portion.

3. A heat sink clip according to claim 2 where said slot substantially extends in a direction between said two arm portions.

4. A heat sink clip according to claim 3 where said clip comprises a unitary metallic member forming said U shape.

5. A heat sink clip according to claim 4 where said metallic member comprises at least one of the materials consisting of beryllium copper and spring steel.

6. A heat sink clip according to claim 2 where said central apex portion is curved in shape between said two arm portions.

7. A heat sink clip according to claim 6 wherein portions of each of said two arm portions at a distance from said central apex portion are nominally spaced apart from each other by a dimension which is less than the spacing between the two arm portions at their juncture to the central apex portion.

8. A heat sink clip according to claim 2 wherein portions of each of said two arm portions at a distance from said central apex portion are nominally spaced apart from each other by a dimension which is less than the spacing between the two arm portions at their juncture to the central apex portion.

9. A heat sink clip according to claim 8 wherein said clip comprises a unitary metallic member forming said U shape.

10. A heat sink clip assembly comprising:
a heat sink having a surface to which a power dissipation device is to be thermally coupled;
a power dissipation device to be attached to said heat sink and having a surface intended for heat transfer coupling to said heat sink surface; and
a heat sink clip for attaching said power dissipation device to said heat sink by providing a force for biasing said power dissipation device surface toward and in thermal conductive contact with said heat sink surface,
wherein said heat sink clip comprises:
a generally U-shaped clip constructed of resilient spring material and having a central apex portion and at least two arm portions forming arms of said U shape, each of said arm portions extending away from associated opposite ends of said central apex portion, respectively, and forming an open end of said clip between said arm portions;
one of said arm portions having a surface thereof coupled to said power dissipation device, said one of said arm portions biasing said power dissipation device surface toward said heat sink surface; and
said central apex portion having a slot therein extending through said central apex portion, whereby said slot permits passage of either a portion of said power dissipation device to be heat sunk or permits passage of an insertion tool which facilitates attaching said heat sink clip about said power dissipation device and said heat sink.

11. A heat sink assembly according to claim 10 wherein another one of said arm portions of said heat sink clip is coupled to said heat sink, said arm portions, therefore, forming a sandwich structure with said heat sink and said power dissipation device therebetween.

12. A heat sink assembly according to claim 11 wherein said slot extends at least substantially across said central apex portion.

13. A heat sink assembly according to claim 12 wherein said slot substantially extends in a direction between said two arm portions.

14. A heat sink assembly according to claim 13 wherein said power dissipation device comprises a body with electrical leads extending away from the body.

15. A heat sink assembly according to claim 14 which includes a circuit board having conductive paths thereon which are connected to said device electrical leads.

16. A heat sink assembly according to claim 15 wherein said electrical leads extend from said device body away from said slot.

17. A heat sink assembly according to claim 15 wherein said electrical leads extend from said device body through said slot and toward said circuit board.

18. A heat sink assembly according to claim 15 wherein said power dissipation device comprises a semiconductor device which includes a metallic plate surface corresponding to said power dissipation device surface.

19. A method for manufacturing a heat sink assembly, comprising the steps of:
providing a heat sink having a surface to which a power dissipation device is to be thermally coupled to;
providing a power dissipation device to be attached to said heat sink and having a surface intended for heat transfer coupling to said heat sink surface;
providing a heat sink clip having a generally U shape and constructed of resilient spring material, said clip having a central apex portion and at least two arm portions extending away from associated opposite ends of said central apex portion, respectively, and forming an open end of said clip between said arm portions, one of said arm portions having a surface thereof to be coupled to said power dissipation device for biasing said power dissipation device surface toward said heat sink surface, said central apex portion having a slot therein extending through said central apex portion;
using at least one tool inserted between said arm portions of said clip to provide said arm portions of said clip further apart than normal;
providing the combination of said heat sink and power dissipation device between said arm portions of said clip while said arm portions are spaced apart further than normal by said one tool; and
removing said one tool and allowing said arm portions to attempt to return to their normal spacing, thus clamping said device and heat sink therebetween, whereby said slot permits passage of either a portion of said power dissipation device to be heat sunk or permits passage of an insertion tool which facilitates attaching said heat sink clip about said power dissipation device and said heat sink.

20. A method according to claim 19 wherein said tool using step includes inserting a first tool into the open end of said U-shaped clip, said first tool having two separable extending projections which initially are adjacent each other and are subsequently separated so as to contact and spread said clip arm portions apart further than normal.

21. A method according to claim 20 wherein said tool using step includes, after said first tool projections have expanded the spacing between said arm portions, inserting a second (transfer) tool through said clip slot, said second tool having projections which, when separated, will contact said arm portions and maintain them in a separated further than normal position.

22. A method according to claim 21 wherein said tool using step includes the step of moving said first tool projections adjacent such that now said second tool projections maintain said arm portions in a further than normal separated position.

23. A method according to claim 22 wherein said removing step includes the step of moving said second tool projections adjacent each other.

24. A method according to claim 23 wherein said removing step includes the step of removing said second tool projections through said slot.

25. A method according to claim 19 wherein said tool using step includes the step of inserting projections of a tool through said clip slot, said projections contacting said arm portions and providing for spacing them apart at said further than normal spacing.

26. A method according to claim 19 wherein said tool using step includes the steps of first providing said heat sink clip with said arm portions positioned on opposite sides of said heat sink and then inserting a tool into the open end of said clip between said arm portions to provide a force between said arm portions to spread said arm portions further apart.

27. A method according to claim 26 wherein said step of providing said heat sink and device between said clip arm portions comprises inserting said device between one of said arm portions and said heat sink while said arm portions are spread apart by said tool being provided between said arm portions.

28. A method according to claim 27 wherein said device has electrical leads extending from a body and wherein during said step of providing said heat sink and device between said clip arm portions, said leads are positioned to extend through said slot.

29. A method according to claim 28 which includes the step of soldering said leads, after said body is positioned between said arm portions and while said leads extend through said slot, to a metallized circuit board positioned on one side of said clip while said device body is positioned on another side of said clip.

30. A method according to claim 19 wherein said tool using step includes inserting a first tool into the open end of said U-shaped clip, said first tool having projections which contact and spread said clip arm portions apart further than normal.

* * * * *